United States Patent
Howder et al.

(10) Patent No.: US 10,847,538 B2
(45) Date of Patent: *Nov. 24, 2020

(54) METHODS OF FORMING AN ARRAY OF ELEVATIONALLY-EXTENDING STRINGS OF MEMORY CELLS

(71) Applicant: Micron Technology, Inc., Boise, ID (US)

(72) Inventors: Collin Howder, Meridian, ID (US); Ryan M. Meyer, Boise, ID (US); Chet E. Carter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 66 days.

This patent is subject to a terminal disclaimer.

(21) Appl. No.: 16/272,547

(22) Filed: Feb. 11, 2019

(65) Prior Publication Data
US 2019/0198526 A1 Jun. 27, 2019

Related U.S. Application Data

(63) Continuation of application No. 15/890,503, filed on Feb. 7, 2018, now Pat. No. 10,236,301.
(Continued)

(51) Int. Cl.
*H01L 21/02* (2006.01)
*H01L 27/11582* (2017.01)
(Continued)

(52) U.S. Cl.
CPC .. *H01L 27/11582* (2013.01); *H01L 21/02164* (2013.01); *H01L 21/02238* (2013.01);
(Continued)

(58) Field of Classification Search
CPC ......... H01L 27/11582; H01L 21/02238; H01L 21/77; H01L 21/8239; H01L 21/8229;
(Continued)

(56) References Cited

U.S. PATENT DOCUMENTS 10,236,301 B1 * 3/2019 Howder ............ H01L 21/76834
10,388,665 B1 8/2019 Xie et al.
(Continued)

OTHER PUBLICATIONS

U.S. Appl. No. 16/251,241, filed Jan. 18, 2019, by Howder et al.
(Continued)

*Primary Examiner* — Thanh T Nguyen
(74) *Attorney, Agent, or Firm* — Wells St. John P.S.

(57) ABSTRACT

A method of forming an array of elevationally-extending strings of memory cells comprises forming conductively-doped semiconductor material directly above and electrically coupled to metal material. A stack comprising vertically-alternating insulative tiers and wordline tiers is formed directly above the conductively-doped semiconductor material. Horizontally-elongated trenches are formed through the stack to the conductively-doped semiconductor material. The conductively-doped semiconductor material is oxidized through the trenches to form an oxide therefrom that is directly above the metal material. Transistor channel material is provided to extend elevationally along the alternating tiers. The wordline tiers are provided to comprise control-gate material having terminal ends corresponding to control-gate regions of individual memory cells. Charge-storage material is between the transistor channel material and the control-gate regions. Insulative charge-passage material is between the transistor channel material and the charge-storage material. A charge-blocking region is between the charge-storage material and individual of the control-gate regions.

23 Claims, 18 Drawing Sheets

Related U.S. Application Data

(60) Provisional application No. 62/610,854, filed on Dec. 27, 2017.

(51) Int. Cl.

| | | |
|---|---|---|
| *H01L 27/11524* | (2017.01) | |
| *H01L 27/11556* | (2017.01) | |
| *H01L 27/1157* | (2017.01) | |
| *H01L 23/522* | (2006.01) | |
| *H01L 23/532* | (2006.01) | |
| *H01L 21/768* | (2006.01) | |
| *H01L 21/3205* | (2006.01) | |
| *H01L 27/11565* | (2017.01) | |
| *H01L 21/321* | (2006.01) | |

(52) U.S. Cl.
CPC .. *H01L 21/32055* (2013.01); *H01L 21/76834* (2013.01); *H01L 21/76877* (2013.01); *H01L 23/5226* (2013.01); *H01L 23/5329* (2013.01); *H01L 23/53271* (2013.01); *H01L 27/1157* (2013.01); *H01L 27/11524* (2013.01); *H01L 27/11556* (2013.01); *H01L 27/11565* (2013.01); *H01L 21/32105* (2013.01)

(58) Field of Classification Search
CPC ......... H01L 21/28282; H01L 21/28273; H01L 21/32055; H01L 21/76877; H01L 21/76834; H01L 23/53271; H01L 21/02164; H01L 23/5226; H01L 27/1157; H01L 27/11556; H01L 27/11524; H01L 23/5329
See application file for complete search history.

(56) References Cited

U.S. PATENT DOCUMENTS

| | | | |
|---|---|---|---|
| 2011/0151633 A1* | 6/2011 | Park | .......... H01L 27/10876 438/270 |
| 2014/0014889 A1 | 1/2014 | Shim et al. | |
| 2015/0318301 A1 | 11/2015 | Lee et al. | |
| 2016/0268302 A1 | 9/2016 | Lee et al. | |
| 2017/0207226 A1 | 7/2017 | Lee | |
| 2017/0278859 A1 | 9/2017 | Sharangpani et al. | |

OTHER PUBLICATIONS

U.S. Appl. No. 16/445,065, filed Jun. 18, 2019, by Hopkins et al.
Okinaka et al., "Electroless Plating of Platinum Group Metals", Chapter 16 of Electroless plating: fundamentals and applications, Eds, Mallory et al., 1990, United Kingdom, pp. 421-440.
U.S. Appl. No. 16/702,255, filed Dec. 3, 2019, by Howder et al.
U.S. Appl. No. 16/787,914, filed Feb. 11, 2020, by Howder et al.
U.S. Appl. No. 16/449,912, filed Jun. 24, 2016, by Howder et al.
U.S. Appl. No. 16/653,062, filed Oct. 15, 2019, by Smith et al.
U.S. Appl. No. 15/992,959, filed May 30, 2018, by Xie et al.

* cited by examiner

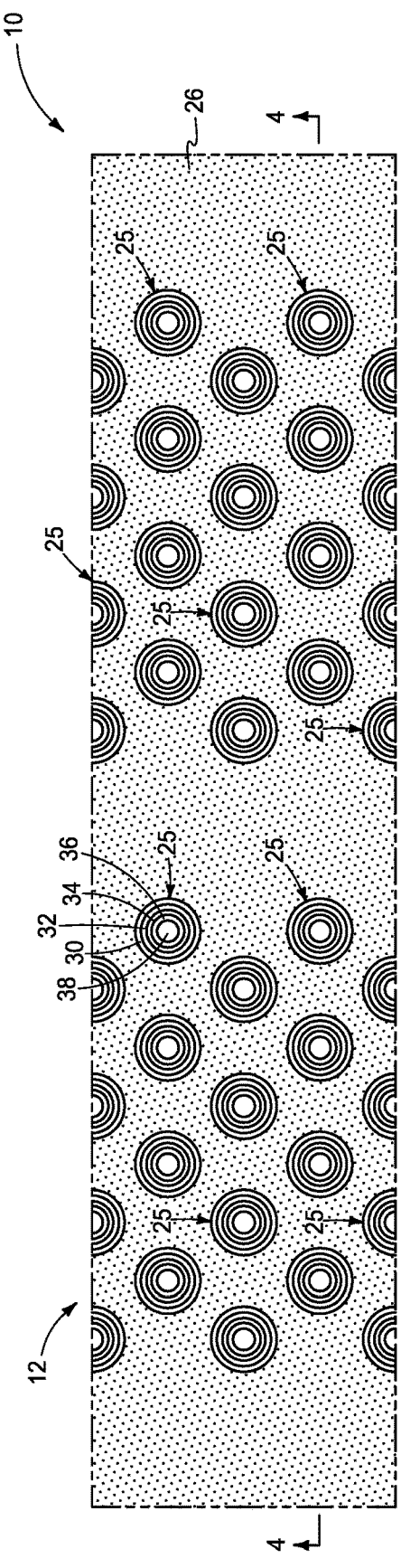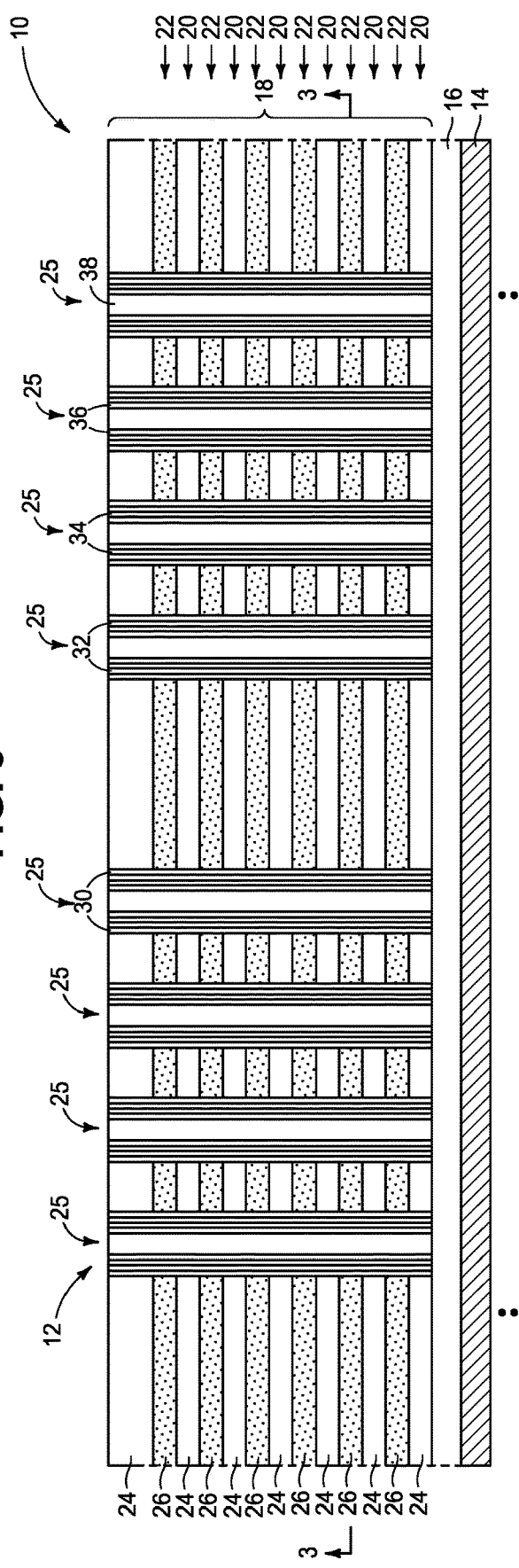
FIG. 3
FIG. 4

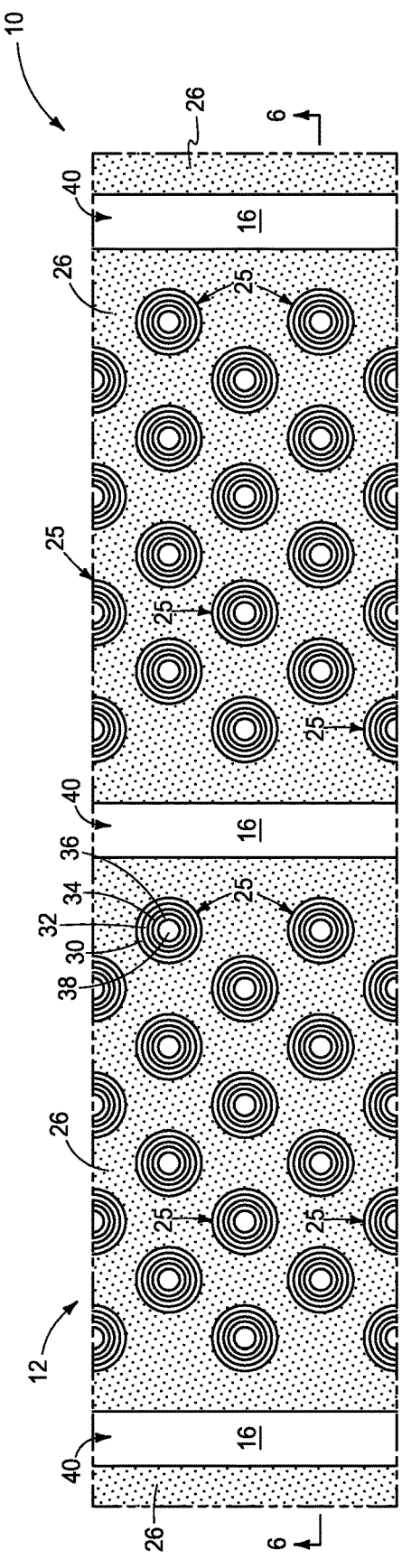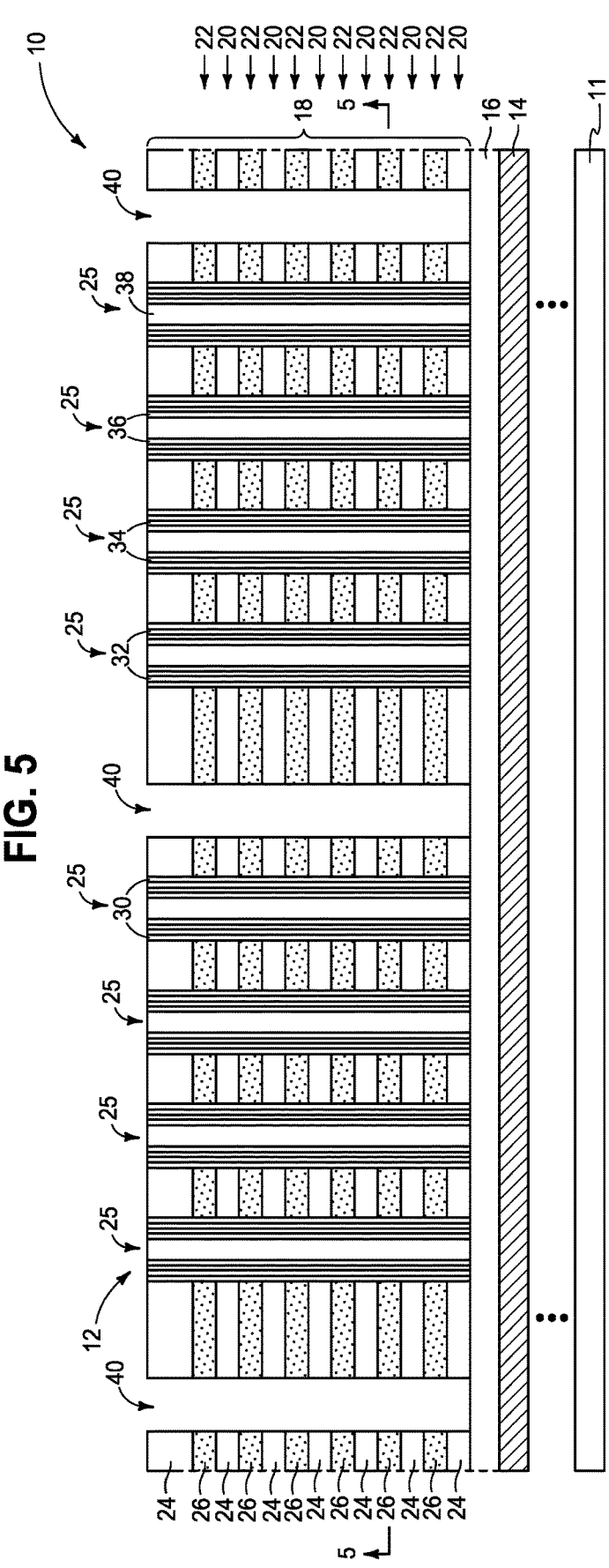

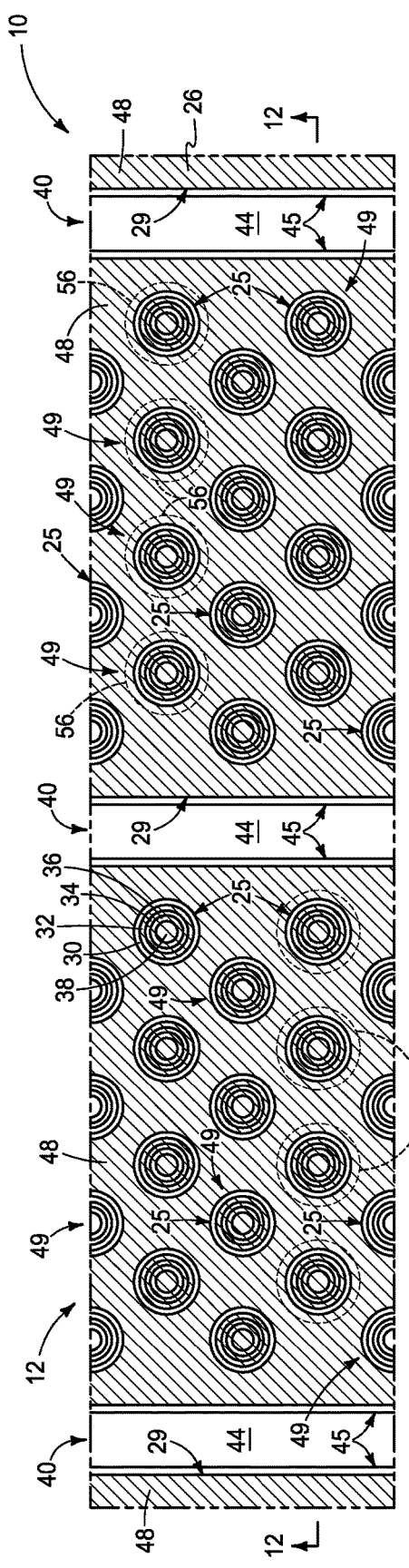
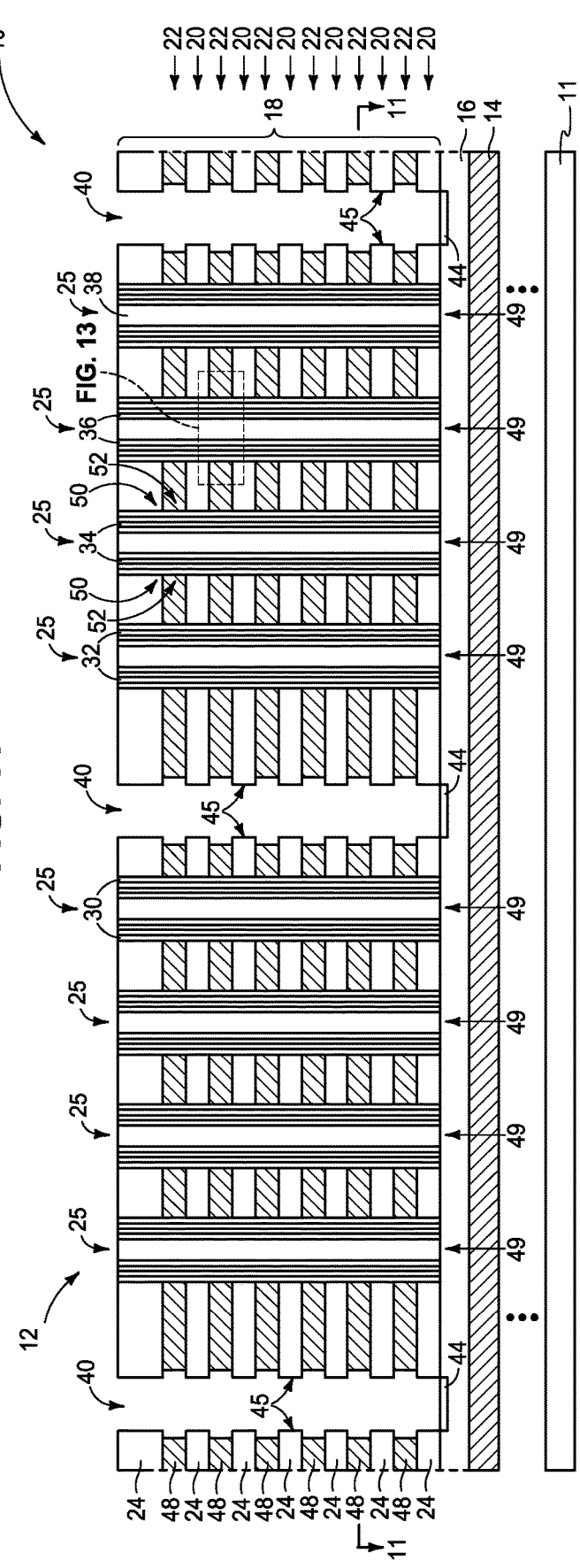
FIG. 11
FIG. 12

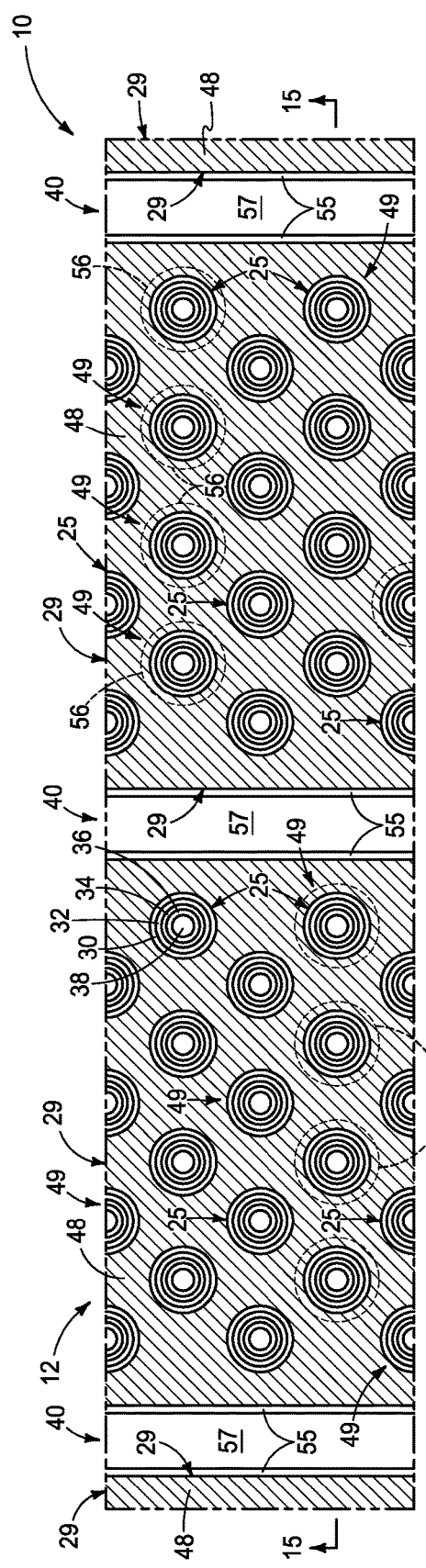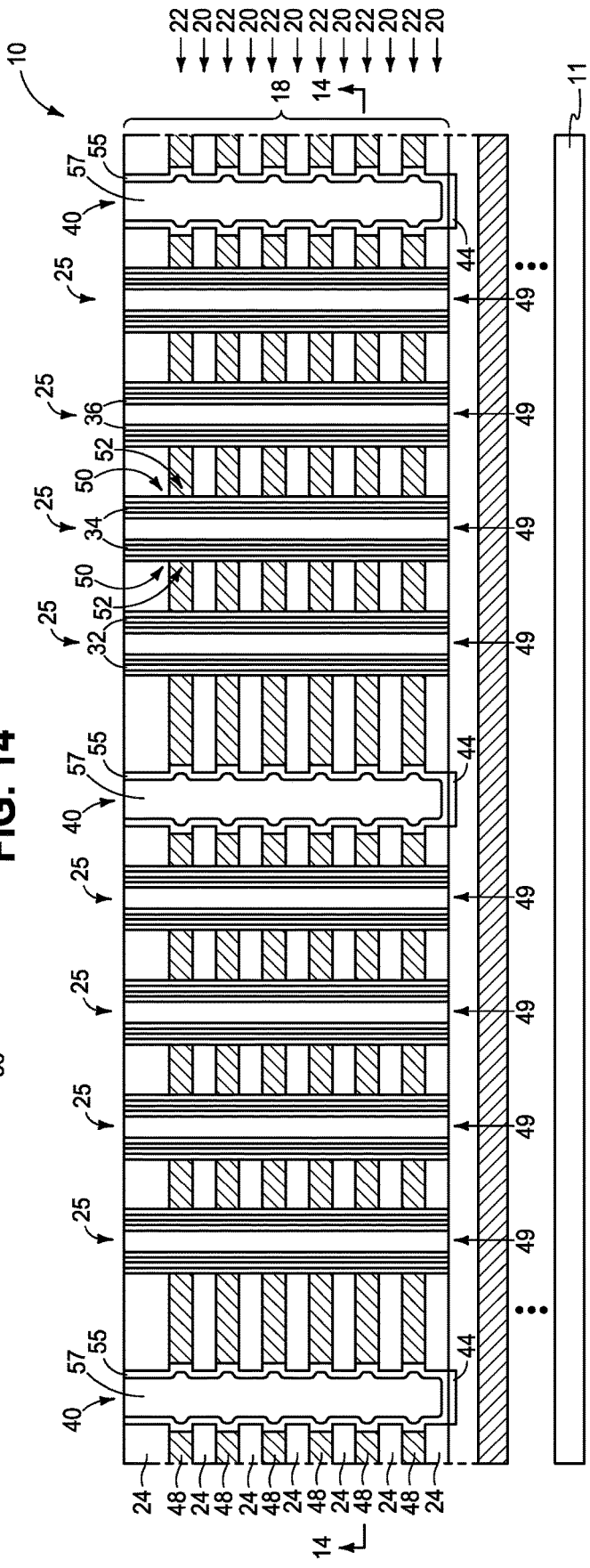
FIG. 14
FIG. 15

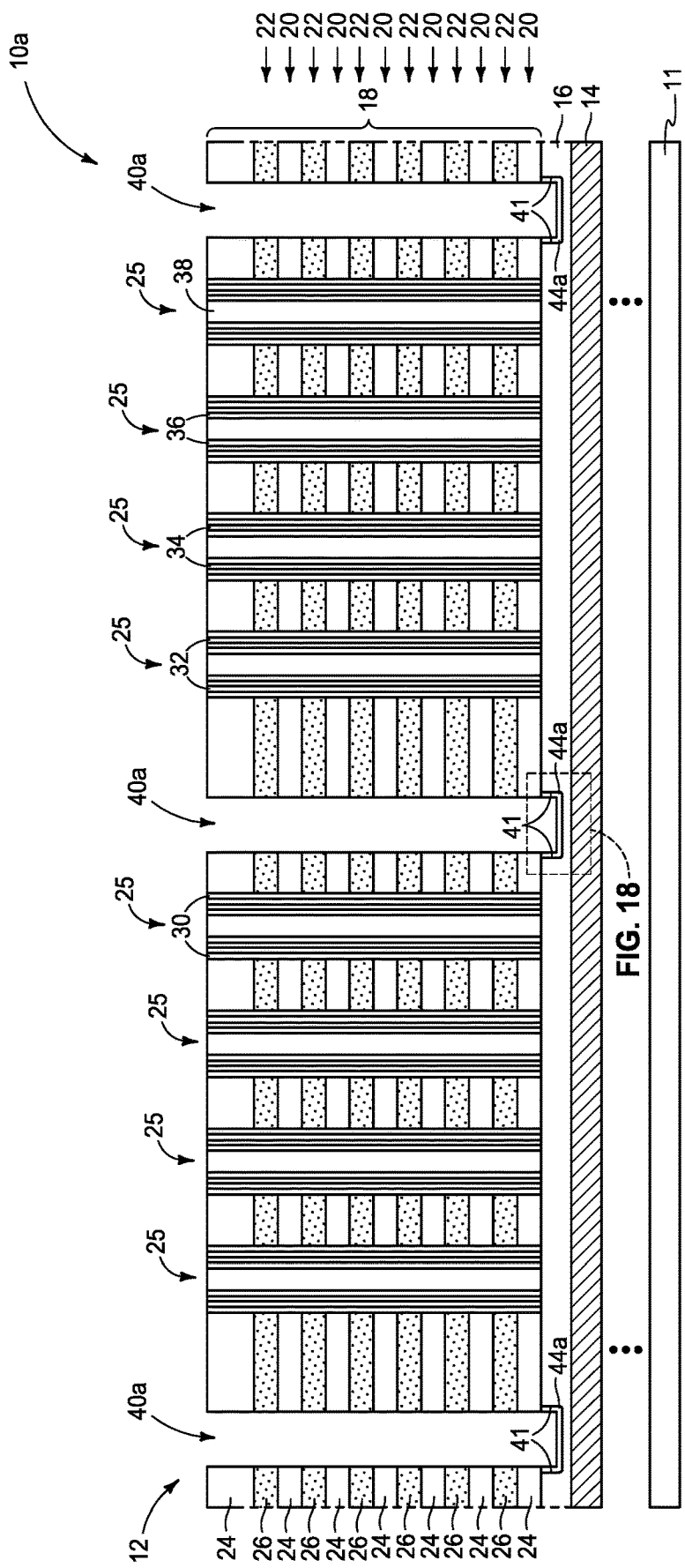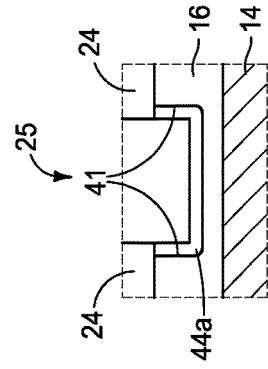

METHODS OF FORMING AN ARRAY OF ELEVATIONALLY-EXTENDING STRINGS OF MEMORY CELLS

RELATED PATENT DATA

This patent resulted from a continuation application of U.S. patent application Ser. No. 15/890,503, filed Feb. 7, 2018, entitled "Methods Of Forming An Array Of Elevationally-Extending Strings Of Memory Cells", naming Collin Howder, Ryan M. Meyer and Chet E. Carter as inventors, which claims benefit of U.S. Provisional Patent Application Ser. No. 62/610,854, filed Dec. 27, 2017, entitled "Methods Of Forming An Array Of Elevationally-Extending Strings Of Memory Cells", naming Collin Howder, Ryan M. Meyer and Chet E. Carter as inventors, the disclosures of which are incorporated by reference.

TECHNICAL FIELD

Embodiments disclosed herein pertain to methods of forming an array of elevationally-extending strings of memory cells.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates, and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may he a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Materials of this other circuitry may undesirably be etched when etching material there-above, for example a silicide of this other circuitry that is under polysilicon below the vertically-stacked memory cells. Such may lead to failed circuitry.

BRIEF DESCRIPTION OF THE DRAWINGS

FIG. 3 is a view of the FIG. 1 substrate at a processing step subsequent to that shown by FIG. 1, and is taken through line 3-3 in FIG. 4.

FIG. 4 is a view taken through line 4-4 in FIG. 3.

FIG. 5 is a view of the FIG. 3 substrate at a processing step subsequent to that shown by FIG. 3, and is taken through line 5-5 in FIG. 6.

FIG. 6 is a view taken through line 6-6 in FIG. 5.

FIG. 11 is a view of the FIG. 10 substrate at a processing step subsequent to that shown by FIG. 10, and is taken through line 11-11 in FIG. 12.

FIG. 12 is a view taken through line 12-12 in FIG. 11.

FIG. 14 is a view of the FIG. 11 substrate at a processing step subsequent o that shown by FIG. 11, and is taken through line 14-14 in FIG. 15.

FIG. 15 is a view taken through line 15-15 in FIG. 14.

FIG. 17 is a view of the FIG. 16 substrate at a processing step subsequent to that shown by FIG. 16.

FIG. 18 is an enlarged view of a portion or the substrate as shown in FIG. 17.

DETAILED DESCRIPTION OF EXAMPLE EMBODIMENTS

Embodiments of the invention encompass methods of forming an array of elevationally-extending strings of memory cells, for example an array of NAND or other memory cells having its peripheral circuitry under the array (e.g., CMOS under-array). Embodiments of the invention encompass so-called "gate-last" or "replacement-gate" processing, so-called "gate-first" processing, and other processing whether existing or yet-to-be-developed independent of when transistor gates are formed. A first example embodiment is described with reference to FIGS. 1-15 which may be considered as a "gate-last" or "replacement-gate" process.

Figure 1:
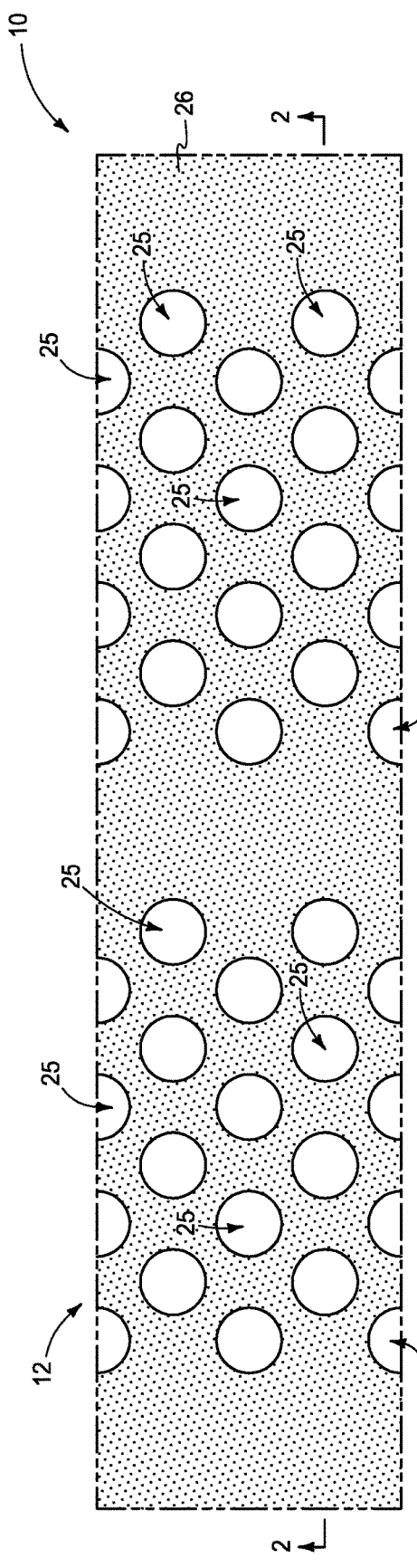
FIG. 1 is a diagrammatic cross-sectional view of a portion of a substrate in process in accordance with an embodiment of the invention, and is taken through line 1-1 in FIG. 2.
Figure 2:
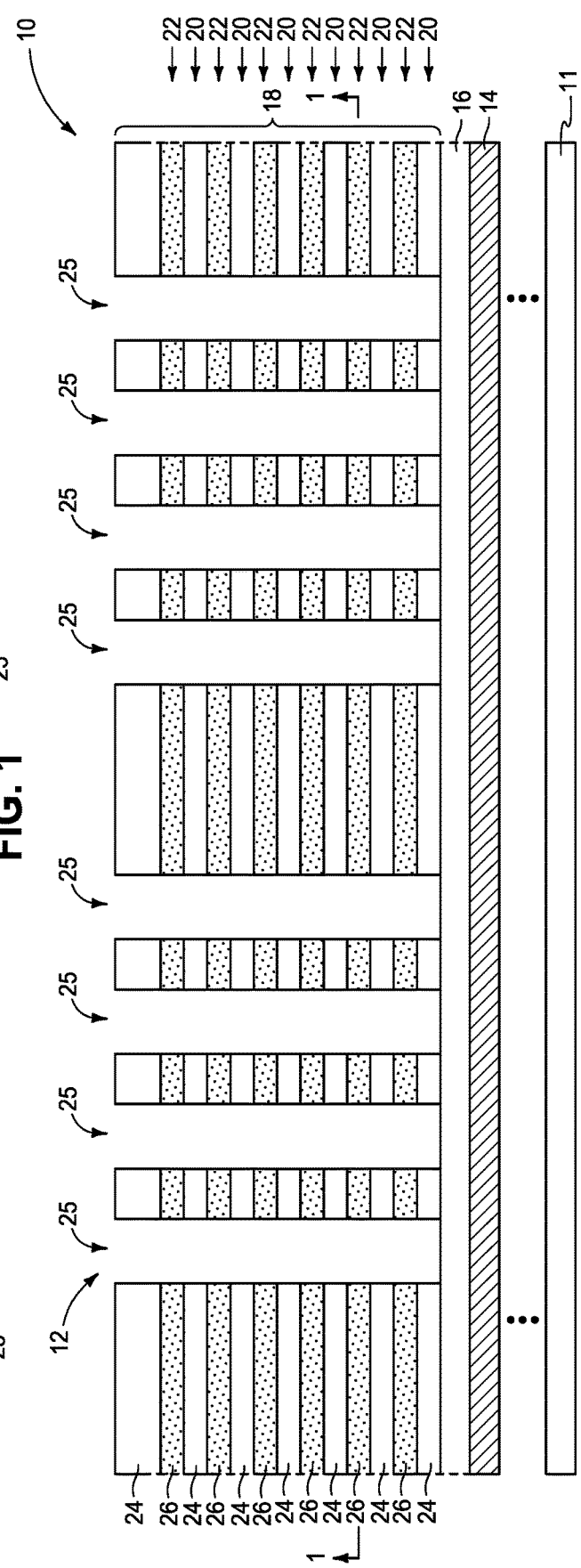
FIG. 2 is a view taken through line 2-2 in F

FIGS. 1 and 2 show a substrate construction 10 in process of a method of forming an array 12 of elevationally-extending strings of memory cells. Substrate construction 10 comprises a base substrate 11 that may include any one or more of conductive/conductor/conducting (i.e., electrically herein), semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1 and 2-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated, and may or may not be wholly or partially within an array or sub-array. Further, multiple sub-arrays may also be fabricated and operated independently, in tandem, or otherwise relative one another. In this document, a "sub-array" may also be considered as an array Conductively-doped semiconductor material 16 has been formed directly above and electrically coupled to a metal material 14. In one embodiment and as shown, conductively-doped semiconductor material 16 and metal material 14 are directly against and directly electrically coupled to one another. In one embodiment, conductively-doped semiconductor material 16 comprises, consists essentially of, or consists of conductively-doped polysilicon, and in one embodiment metal material 14 comprises, consists essentially of, or consists of a silicide, such as tungsten silicide. Conductive material 16, 14 may comprise a part of peripheral-under-array circuitry used to access and control memory cells that will be formed within array 12. Example thicknesses for materials 16 and 14 are 500 Angstroms and 900 Angstroms, respectively.

A stack 18 comprising vertically-alternating insulative tiers 20 and wordline tiers 22 have been formed directly above conductively-doped semiconductor material 16. Insulative tiers 20 comprise insulative first material 24 (e.g., silicon dioxide). Wordline tiers 22 comprise second material 26 that is of different composition from of that of first material 24 (e.g., silicon nitride, and regardless which may be wholly or partially sacrificial). Elevationally-extending channel openings 25 have been formed into alternating tiers 20, 22. By way of example only, such are shown as being arranged in groups or columns of staggered rows of four openings 25 per row. Any alternate existing or yet-to-be-developed arrangement and construction may be used. Use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles. Other circuitry that may or may not be part of peripheral circuitry may be between conductively-doped semiconductor material 16 and stack 18.

Referring to FIGS. 3 and 4, charge-blocking material 30 (i.e., a charge block) has been formed in channel openings 25 elevationally along alternating tiers 20, 22. Material 30 may be a composite of different composition layers, for example silicon dioxide-silicon nitride-silicon dioxide. Charge-storage material 32 has been formed in channel openings 25 elevationally along alternating tiers 20, 22 and charge-blocking material 30. Charge-storage material 32 may comprise any suitable composition(s) and, in some embodiment, may comprise floating gate material (e.g., doped or undoped silicon) or charge-trapping material (e.g., silicon nitride, metal dots, etc.). Insulative charge-passage material 34 has been formed in channel openings 25 elevationally along alternating tiers 20, 22 and insulative charge-storage material 32. Charge-passage material 34 may be, by way of example, a bandgap-engineered structure having nitrogen-containing material (e.g., silicon nitride) sandwiched between two insulator oxides (e.g., silicon dioxide). Transistor channel material 36 has been formed in channel openings 25 elevationally along alternating tiers 20, 22 and insulative charge-passage material 34. Example channel materials 36 include appropriately-doped crystalline semiconductor material, such as one or more of silicon, germanium, and so-called III/V semiconductor materials (e.g., GaAs, InP, GaP, and GaN). Example thicknesses for each of materials 30, 32, 34, and 36 is 25 to 100 Angstroms. Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and and/or be devoid of solid material (not shown).

Referring to FIGS. 5 and 6, trenches 40 have been formed through stack 18 to conductively-doped semiconductor material 16 (i.e., at least to material 16). In one embodiment and as shown, trenches 40 are horizontally-elongated (FIG. 5).

Figure 7:
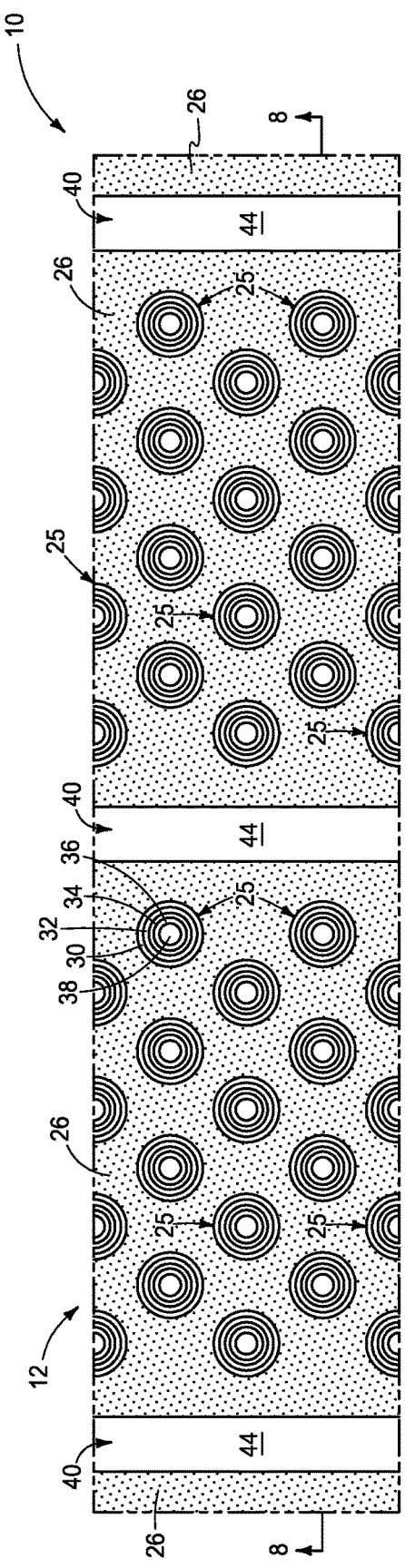
FIG. 7 is a view of the FIG. 5 substrate at a processing step subsequent to that shown by FIG. 5, and is taken through line 7-7 in FIG. 8.
Figure 8:
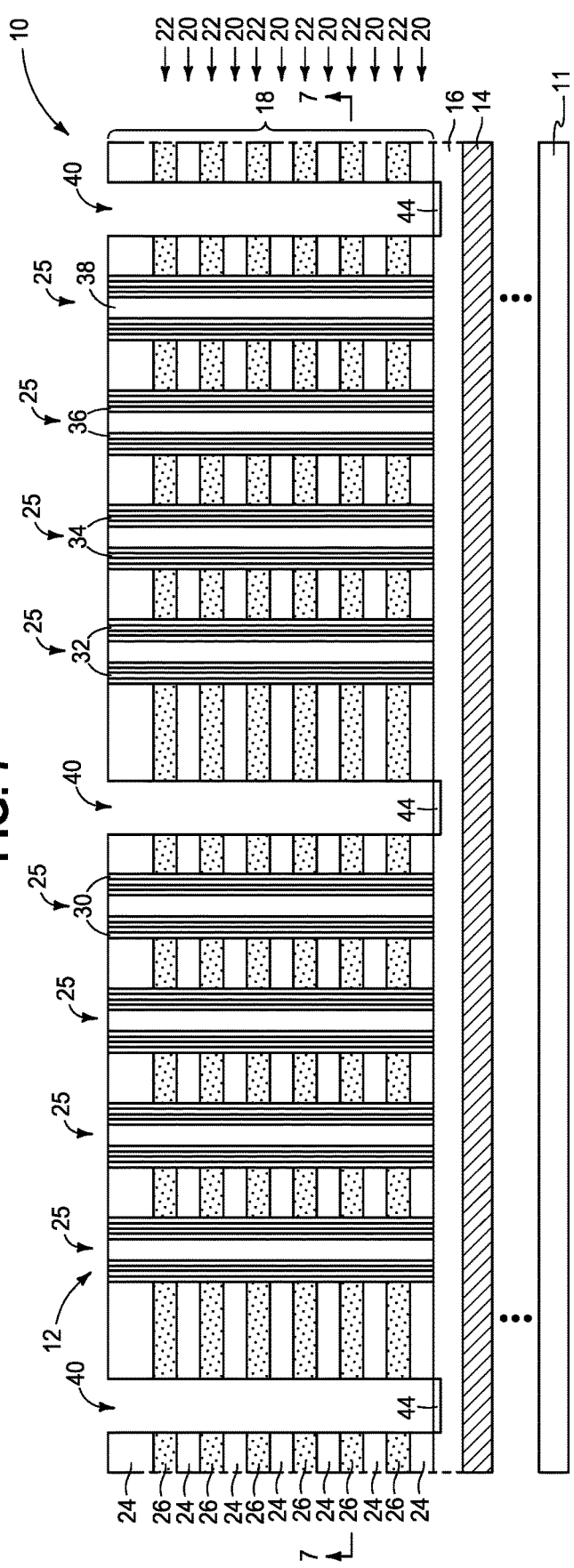
FIG. 8 is a view taken through line 8-8 in FIG. 7.

Referring to FIGS. 7 and 8, conductively-doped semiconductor material 16 has been oxidized through trenches 40 to form an oxide 44 therefrom that is directly above metal material 14. In one embodiment, oxide 44 comprises, consists essentially of, or consists of silicon dioxide, for example where conductively-doped semiconductor material 16 comprises conductively-doped polysilicon. The oxidizing can be conducted wet and/or dry, and using any existing or yet-to-be-developed oxidizing methods. In one example, such oxidizing may occur by in situ steam generation at a chamber pressure of 1 mTorr-100 Torr, substrate temperature of 600° C. to 1,200° C., and using oxidizing gases comprising one more of $H_2O$, $O_2$, and $N_2O$. Remote plasma oxidation may also or alternately be used, for example at a pressure of from 1 to 50 Torr, substrate temperature of 200° C. to 500° C., power at from 1 to 10 kW, a biased or un-biased chuck, and using $O_2$ as a feed gas. Dry plasma oxidation may also he used, such as using an $O_2$ or $H_2O$ plasma at a pressure of 1 to 50 Torr, substrate temperature of 200° C. to 500° C., power at 1-10 kW, and with a biased or un-biased chuck. In one embodiment and as shown, oxide 44 is not directly against metal material 14. In alternate embodiments described below, the oxide may be directly against metal material 14. In one embodiment and as shown, the oxidizing forms oxide 44 completely across a bottom of individual trenches 40. In other embodiments as described below, the oxidizing forms the oxide only partially across a bottom of individual trenches 40. Oxide 44 may extend into trenches 40 (not shown). An example thickness of oxide material 44 is 50 to 200 Angstroms.

Figure 9:
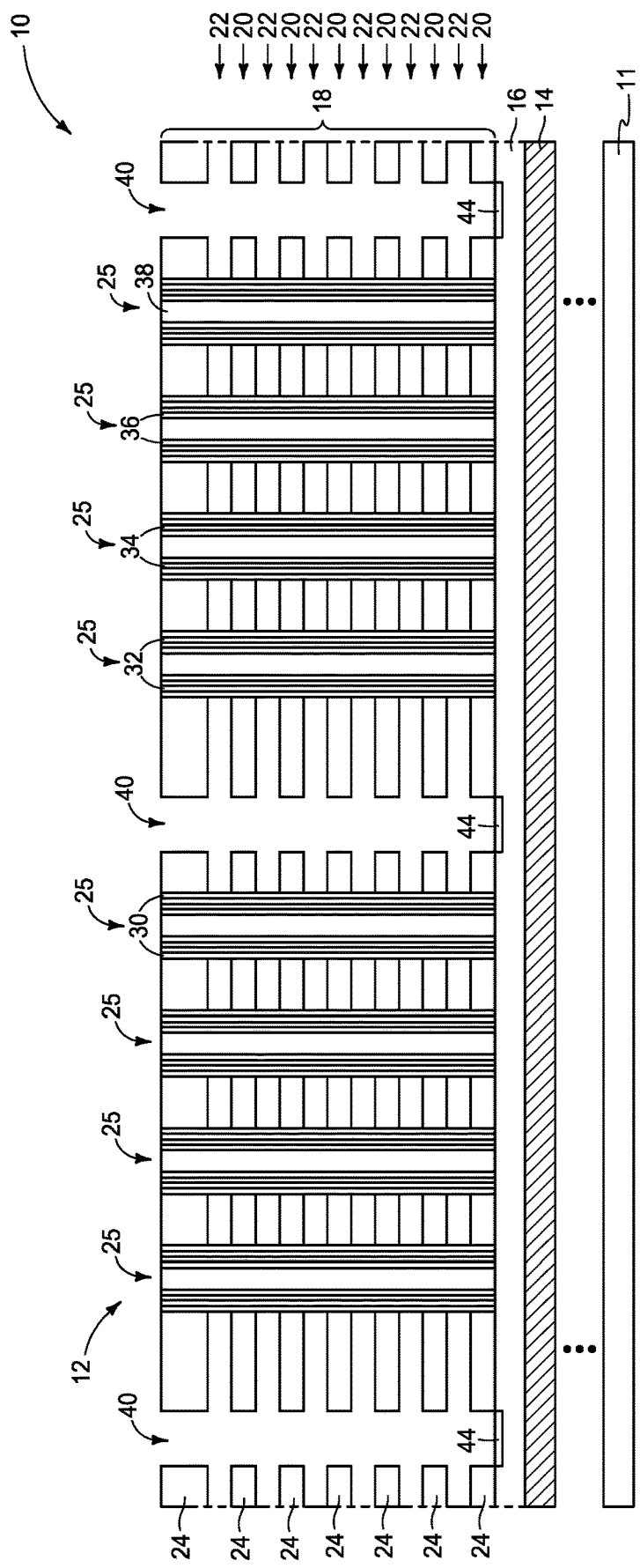
FIG. 9 is a view of the FIG. 7 substrate at a processing step subsequent to that shown by FIG. 7.

Referring to FIG. 9, second material 26 (not shown) of wordline tiers 22 has been etched selectively relative to oxide 44 and insulative first material 24. In one embodiment and as shown, none of conductively-doped semiconductor material 16 is outwardly exposed within trenches 40 during the etching. An example etching chemistry, where second material 26 comprises silicon nitride and first material 24 and oxide 44 comprise insulative oxides (e.g., silicon dioxide), is liquid or vapor etching with $H_3PO_4$ as a primary etchant.

Figure 10:
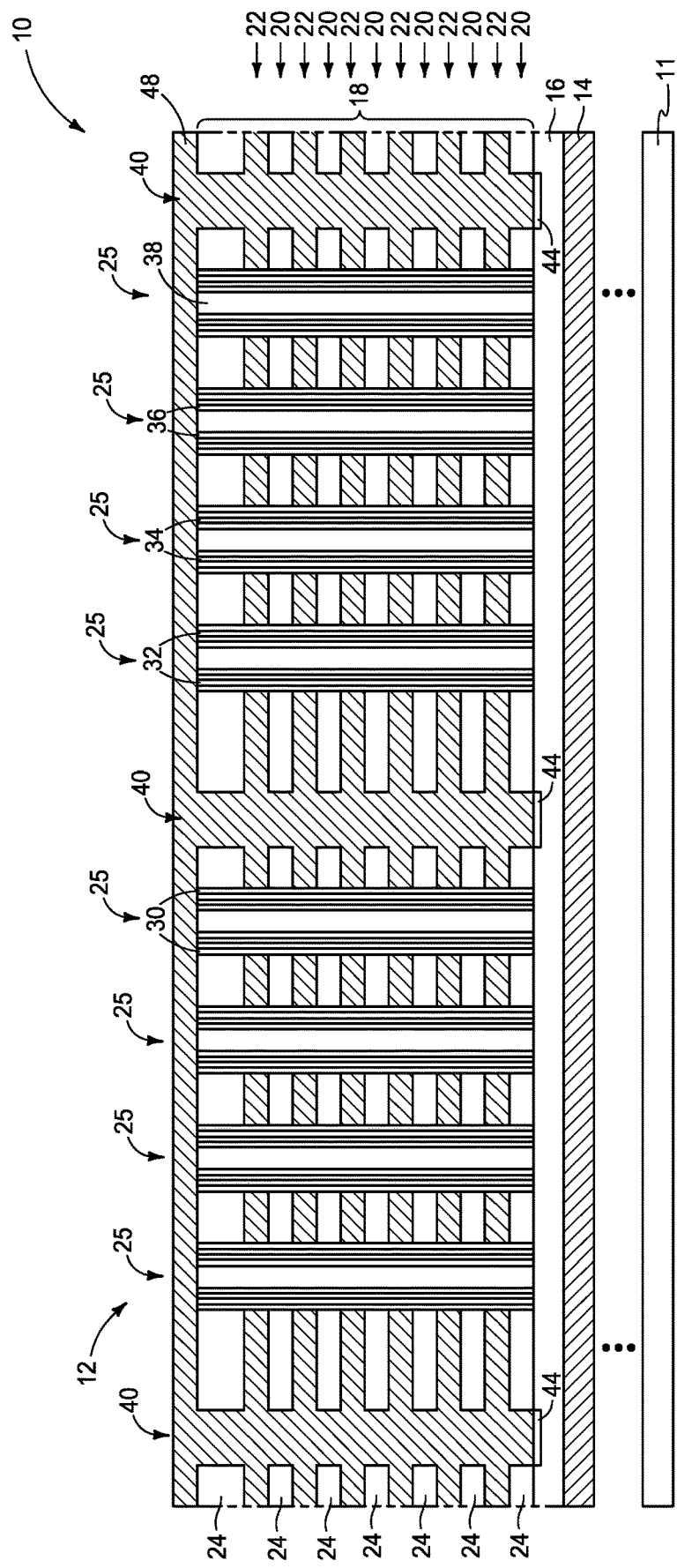
FIG. 10 is a view of the FIG. 9 substrate at a processing step subsequent to that shown by FIG. 9.

Referring to FIG. 10 control-gate material 48 (i.e., conductive material) has been formed into wordline tiers 22 through trenches 40 to be devotionally between insulative first material 24 of alternating tiers 20, 22. Any suitable conductive material may be used, for example one or both of metal material and/or conductively-doped semiconductor material.

Figure 13:
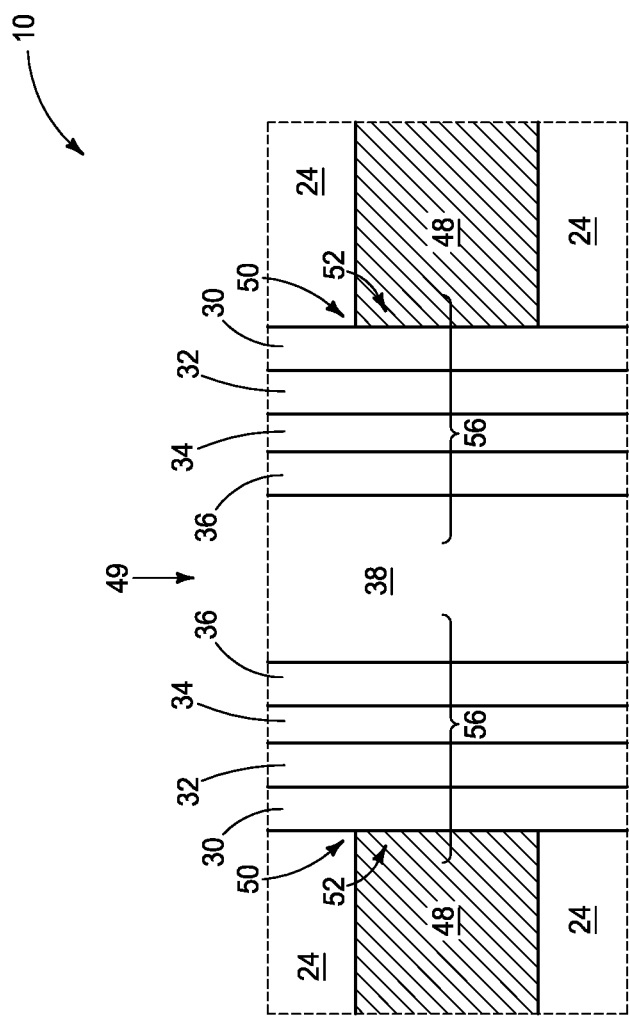
FIG. 13 is an enlarged view of a portion or the substrate as shown in FIG. 12.

Referring to FIGS. 11-13, control-gate material 48 has been removed from trenches 40, and in one embodiment as shown has also been laterally-recessed back from radially-innermost side surfaces 45 of trenches 40, for example by selective wet or dry etching. Such has resulted in formation of control-gate lines 29 and elevationally-extending strings 49 of individual memory cells 56. In one embodiment and as shown, strings 49 are formed to be vertical or within 10° of vertical. Approximate locations of memory cells 56 are indicated with brackets in FIG. 13 and with dashed outlines in FIG. 11, with memory cells 56 being essentially ring-like or annular in the depicted example. Control-gate material 48 has terminal ends 50 corresponding to control-gate regions 52 of individual memory cells 56. Control-gate regions 52 in the depicted embodiment comprise individual portions of individual control-gate lines 29.

A charge-blocking region (e.g., charge-blocking material 30) is between charge-storage material 32 and individual of control-gate regions 52. A charge block may have the following functions in a memory cell: In a program mode, the charge block may prevent charge carriers from passing out of the charge-storage material (e.g., floating-gate material, charge-trapping material, etc.) toward the control gate, and in an erase mode the charge block may prevent charge carriers from flowing into the charge-storage material from the control gate. Accordingly, a charge block may function to block charge migration between the control-gate region and the charge-storage material of individual memory cells. An example charge-blocking region as shown comprises insulator material 30. By way of further examples, a charge-blocking region may comprise a laterally (e.g., radially) outer portion of the charge-storage material (e.g., material 32) where such charge-storage material is insulative (e.g., in the absence of any different-composition material between an insulative-charge-storage material 32 and conductive material 48). Regardless, as an additional example, an interface of a charge-storage material and conductive material of a control gate may be sufficient to function as a charge-blocking region in the absence of any separate-composition-insulator material 30. Further, an interface of conductive material 48 with material 30 (when present) in combination with insulator material 30 may together function as a charge-blocking region, and as alternately or additionally may a laterally-outer region of an insulative-charge-storage material (e.g., a silicon nitride material 32).

FIGS. 14 and 15 show subsequent processing whereby dielectric material 55 (e.g., silicon dioxide) and polysilicon 57 have been formed in trenches 40. Alternately, by way of example, dielectric material may completely fill remaining volume of trenches 40. Any other attribute(s) or aspect(s) as shown and/or described herein with respect to other embodiments may be used.

Figure 16:
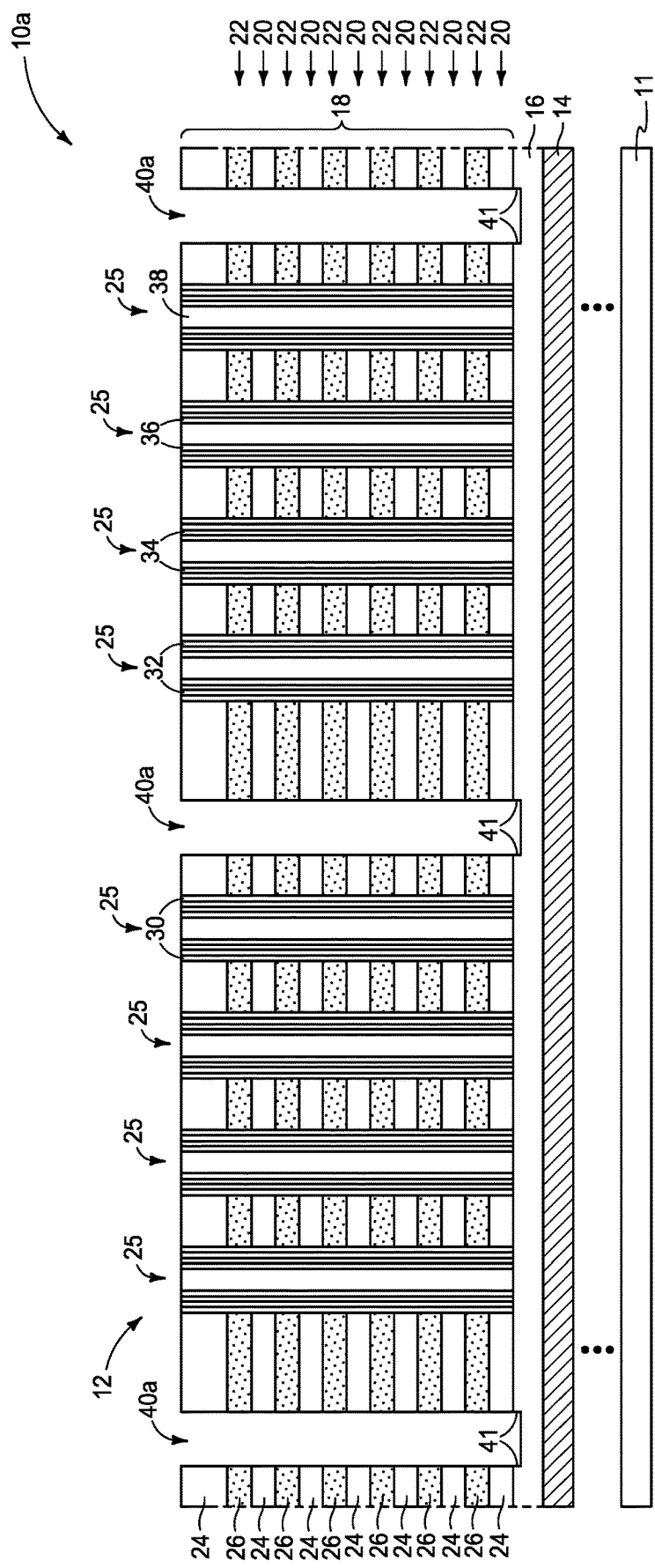
FIG. 16 is a diagrammatic cross-sectional view of a portion of a substrate in process in accordance with an embodiment of the invention.

FIGS. 5 and 6 show an example embodiment wherein the forming of trenches 40 (e.g., by etching) has been sufficiently selective to stop on conductively-doped semiconductor material 16. FIG. 16 shows an alternate example embodiment construction 10a. Like numerals from the above-described embodiments have been used where appropriate, with some construction differences being indicated with the suffix "a" or with different numerals. Trenches 40a have been formed into conductively-doped semiconductor material 16 to form trenches 40a to have sidewalk 41 comprising conductively-doped semiconductor material 16.

Referring to FIGS. 17 and 18, conductively-doped semiconductor material 16 has been oxidized through trenches 40a to form oxide 44a therefrom that is directly above metal material 14. Such oxidizing forms oxide 44a all along conductively-doped-semiconductor-material sidewalls 41. Oxide 44a may extend into trenches 40a (not shown). Regardless, in one embodiment and as shown, trenches 40a have been formed only partially into conductively-doped semiconductor material 16 whereby metal material 14 is not outwardly exposed during the oxidizing and the oxidizing forms oxide 44a completely across the bottoms of individual trenches 40a, and in one embodiment wherein oxide 44a has an upwardly-open container shape in a vertical straight-line cross-section (e.g., the cross-section that is FIGS. 17 and 18). Subsequent processing may occur as described above. Any other attribute(s) or aspect(s) as shown and/or described herein with respect to other embodiments may be used.

Figure 19:
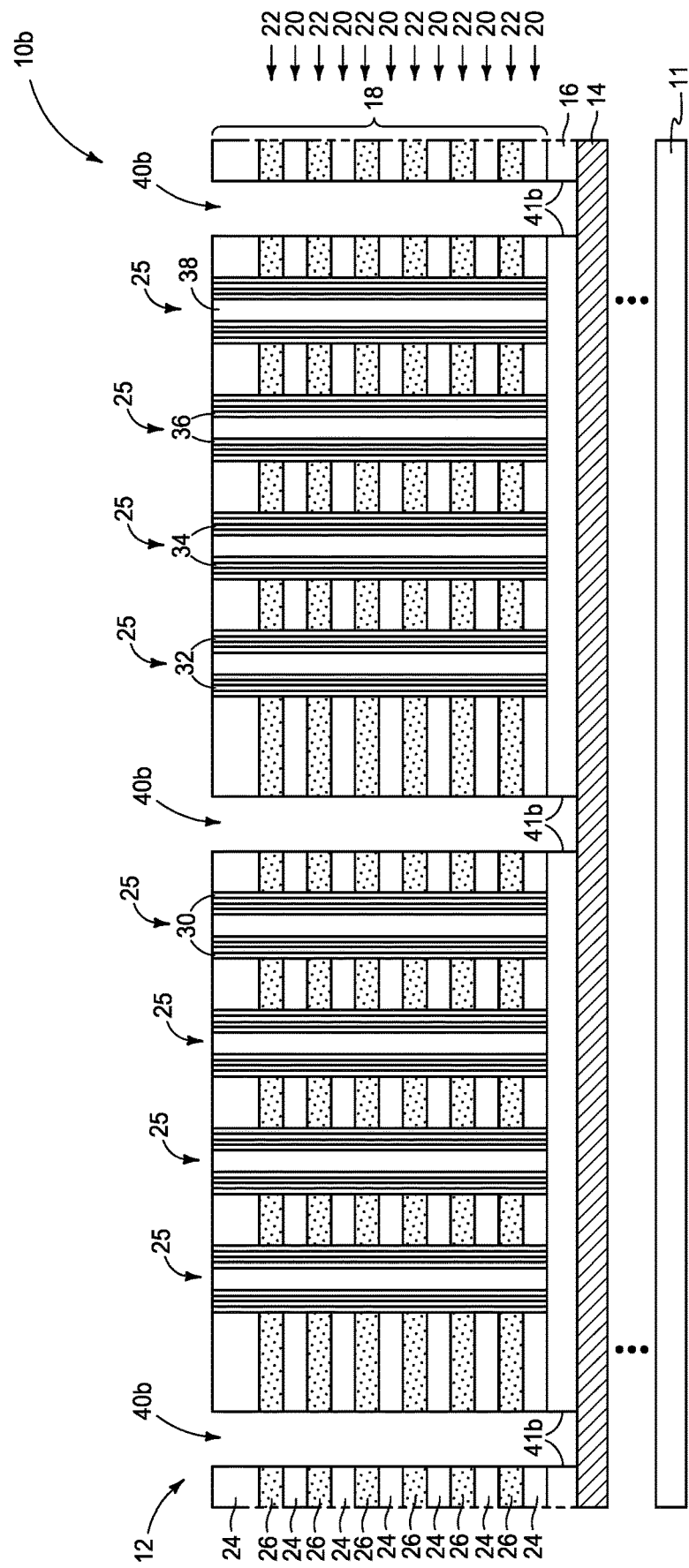
FIG. 19 is a diagrammatic cross-sectional view of a portion of a substrate in process in accordance with an embodiment of the invention.

FIG. 19 shows an alternate embodiment construction 10b to that shown by FIGS. 17 and 18. Like numerals from the above-described embodiments have been used where appropriate, with some construction differences being indicated with the suffix "b" or with different numerals. FIG. 19 shows trenches 40b as having been formed through conductively-doped semiconductor material 16 (i.e., at least some of portions of individual trenches 40*b* going through material 16) to outwardly expose metal material 14 and form conductively-doped semiconductor material sidewalls 41*b*.

Figure 20:
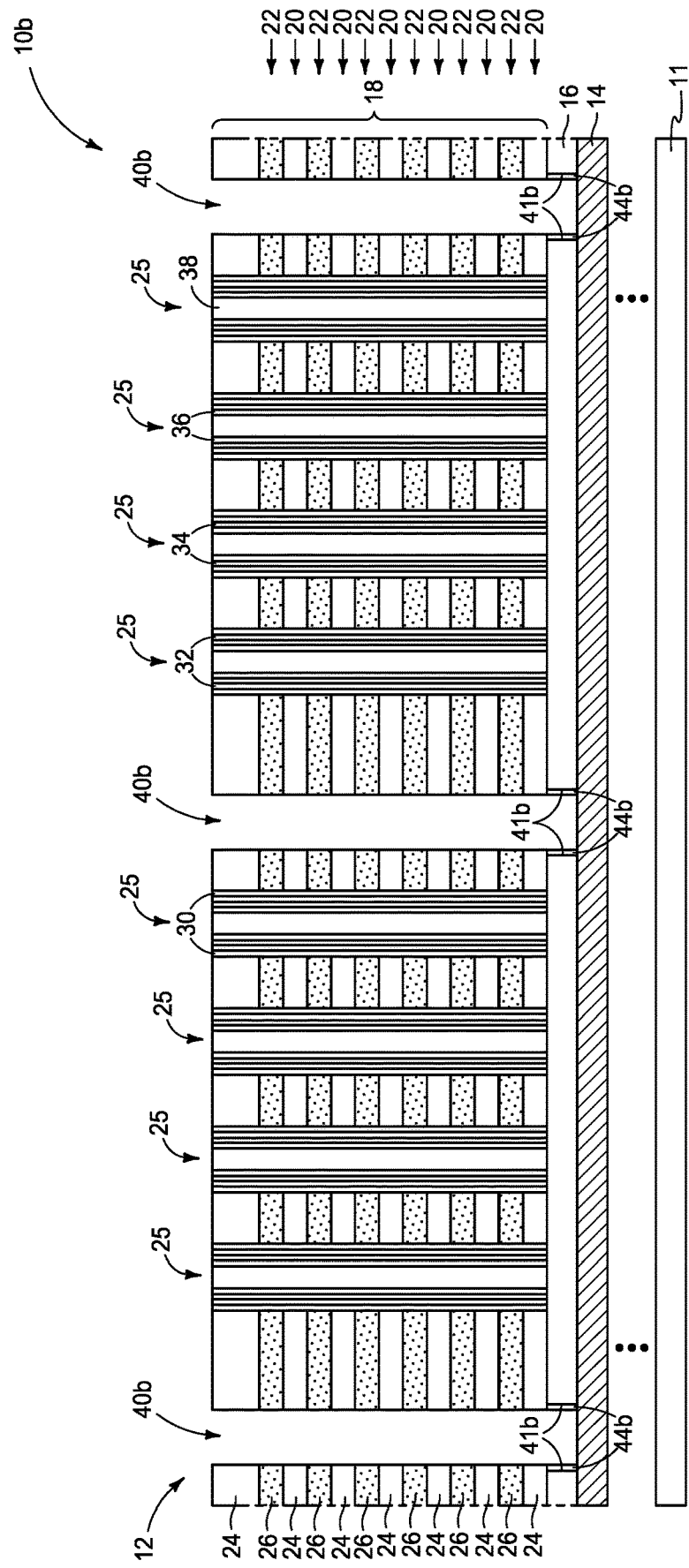
FIG. 20 is a view of the FIG. 19 substrate at a processing step subsequent to that shown by FIG. 19.

Referring to FIG. 20, conductively-doped semiconductor material sidewalls 41*b* have been oxidized to form oxide 44*b* therefrom that is directly above metal material 14 (e.g., even if only above sides laterally-outward of initially formed trenches 40, as shown). In one embodiment and as shown, such oxide is directly against metal material 14, in one embodiment is only partially across a bottom of individual trenches 40*b*, and in one embodiment less-than-completely covers exposed metal material 14. Processing may occur subsequently as described above. Any other attribute(s) or aspect(s) as shown and/or described herein with respect to other embodiments may be used.

Figure 21:
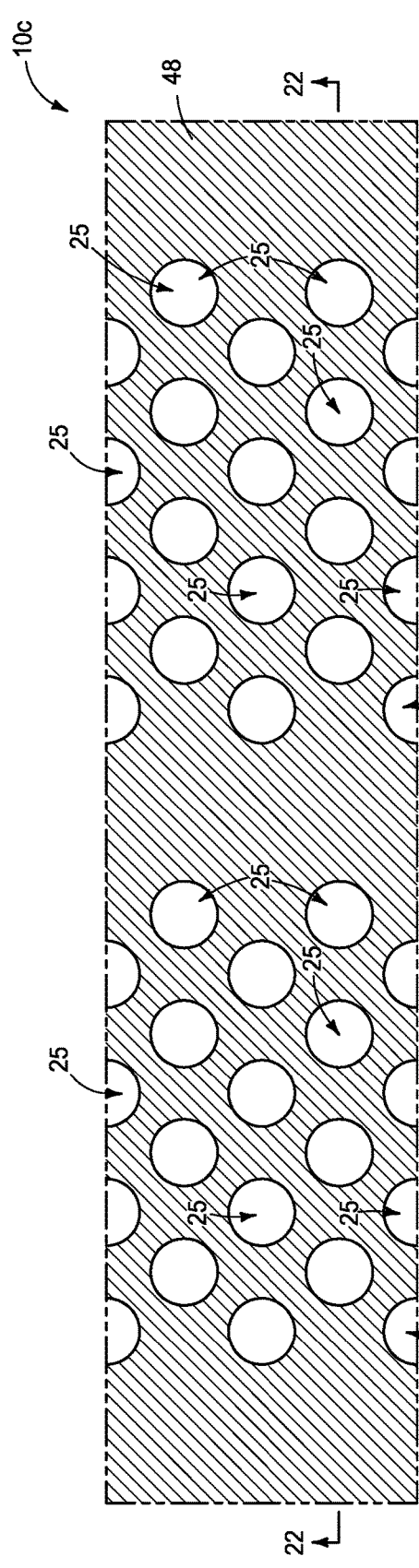
FIG. 21 is a diagrammatic cross-sectional view of a portion of a substrate in process in accordance with an embodiment of the invention, and is taken through line 21-21 in FIG. 22.
Figure 22:
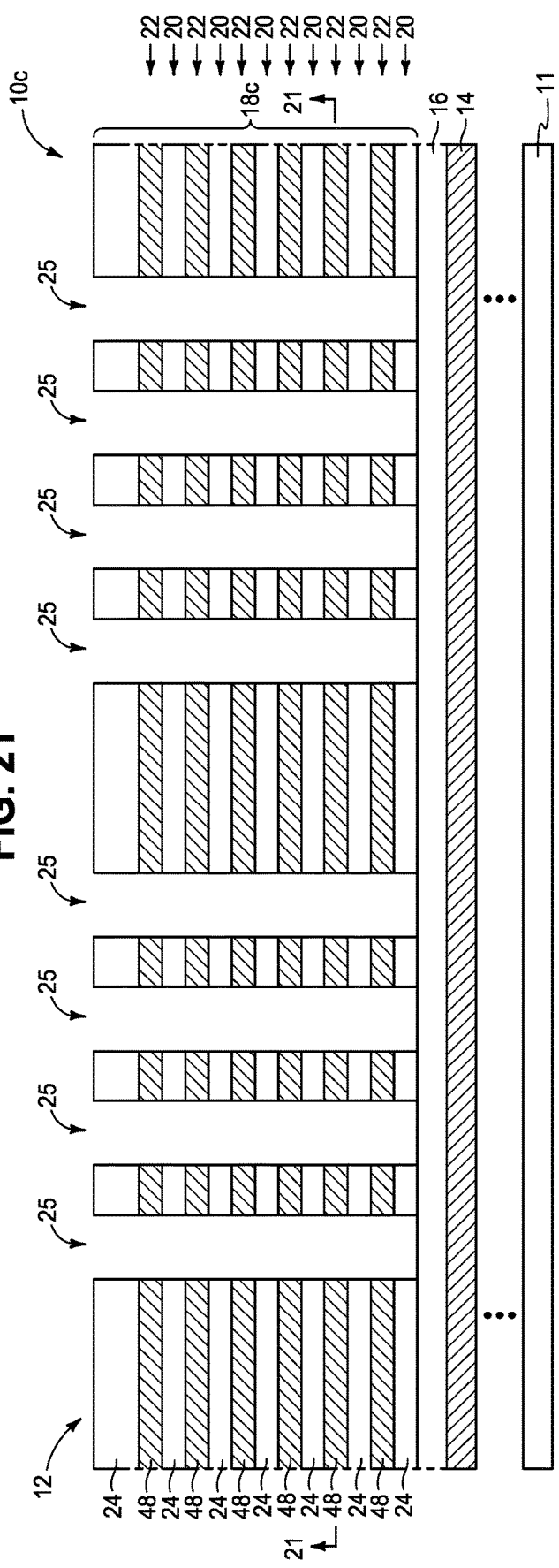
FIG. 22 is a view taken through line 22-22 in FIG. 21.

Another example embodiment method of forming an array of elevationally-extending strings of memory cells is next-described with reference to FIGS. 21-27, and which may be considered as gate-first processing. Like numerals from the above-described embodiments have been used where appropriate, with some construction differences being indicated with the suffix "c" or with different numerals. Referring to FIGS. 21 and 22, stack 18*c* comprising vertically-alternating insulative tiers 20 and wordline tiers 22 has been formed directly above conductively-doped semiconductor material 16. Wordline tiers 22 comprise control-gate material 48. Elevationally-extending channel openings 25 have been formed into alternating tiers 20, 22.

Figure 23:
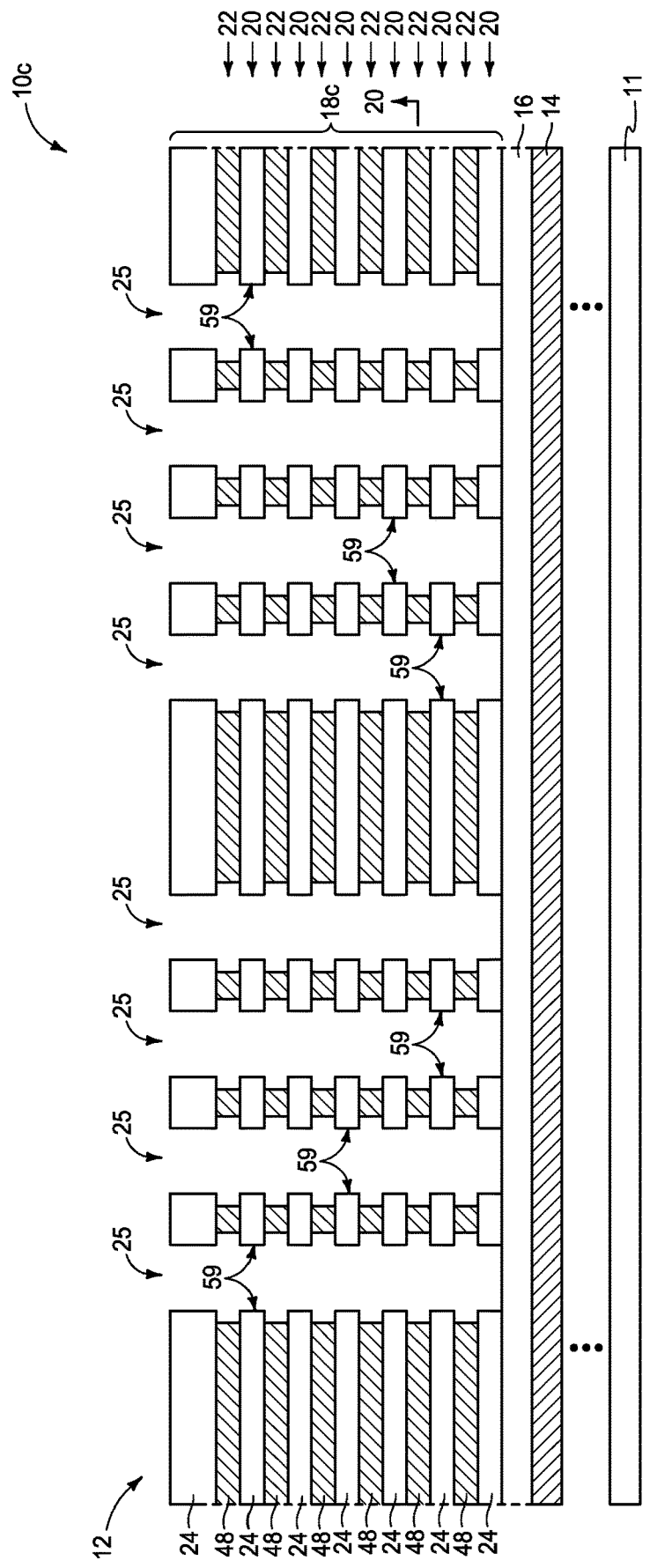
FIG. 23 is a view of the FIG. 22 substrate at a processing step subsequent to that shown by FIG. 22.

Referring to FIG. 23, and in one embodiment, control-gate material 48 has been laterally-recessed (e.g., by selective etching) relative to radially-innermost sidewalls 59 of channel openings 25.

Figure 24:
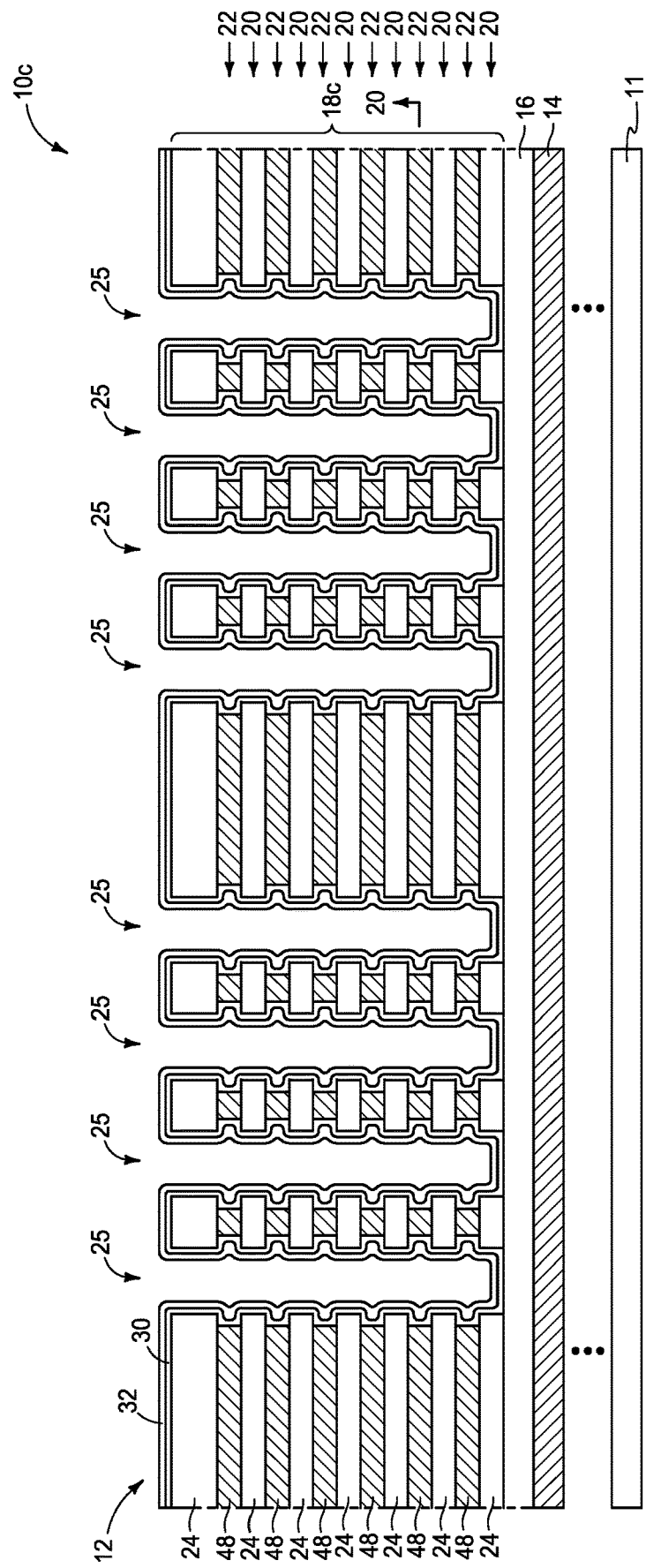
FIG. 24 is a view of the FIG. 23 substrate at a processing step subsequent to that shown by FIG. 23.

Referring to FIG. 24, charge-blocking material 30 and then charge-storage material 32 have been formed in channel openings 25 elevationally along alternating tiers 20, 22.

Figure 25:
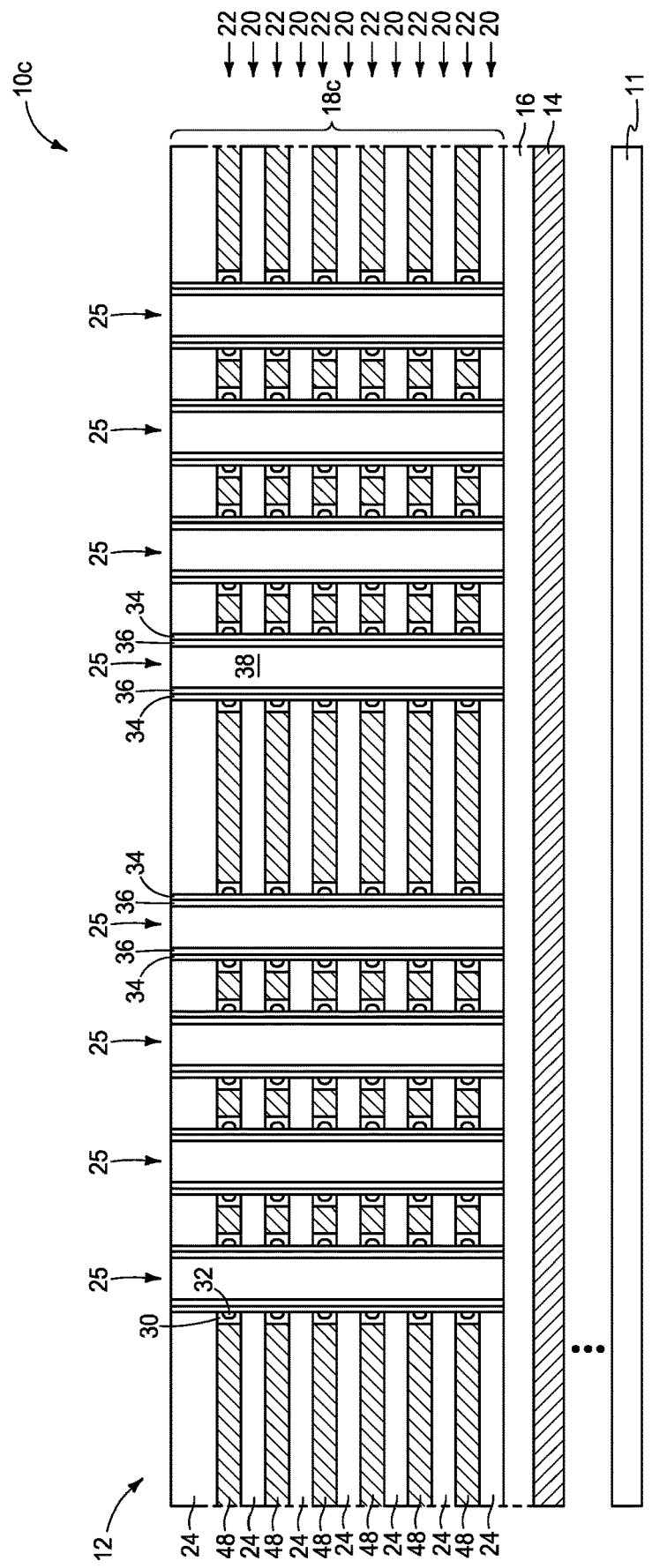
FIG. 25 is a view of the FIG. 24 substrate at a processing step subsequent to that shown by FIG. 24.

Referring to FIG. 25, insulative charge-passage material 34, then transistor channel material 36, and then radially-central dielectric material 38 have been formed in channel openings 25. Materials 24, 36, and 38 may be deposited as conformal layers which are collectively planarized back after depositing all three to produce the example construction as shown in FIG. 25.

Figure 26:
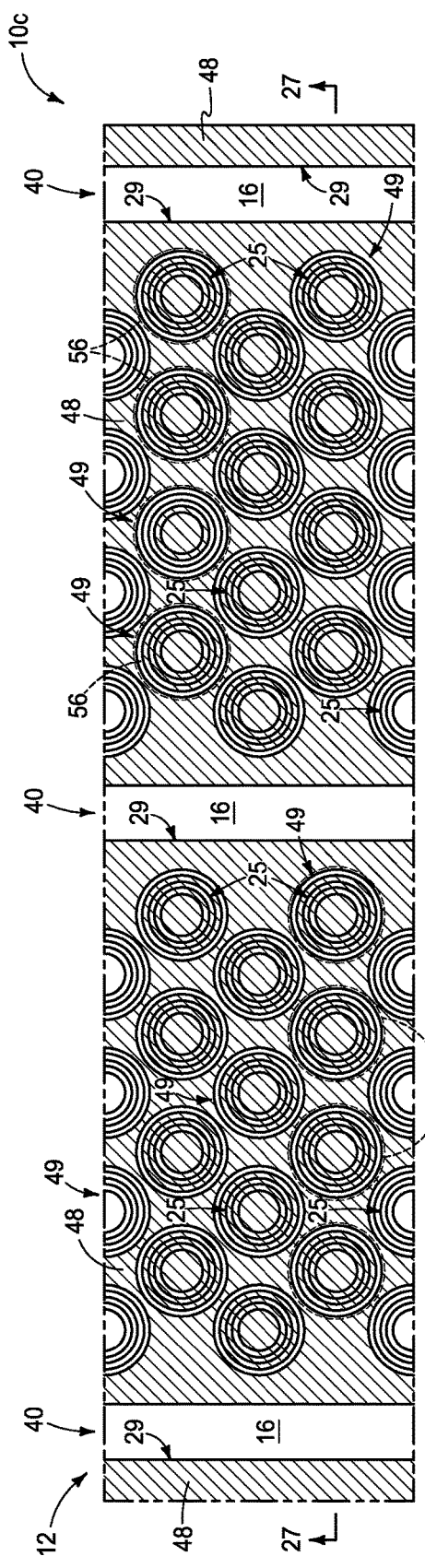
FIG. 26 is a view of the FIG. 25 substrate at a processing step subsequent to that shown by FIG. 25, and is taken through line 26-26 in FIG. 27.
Figure 27:
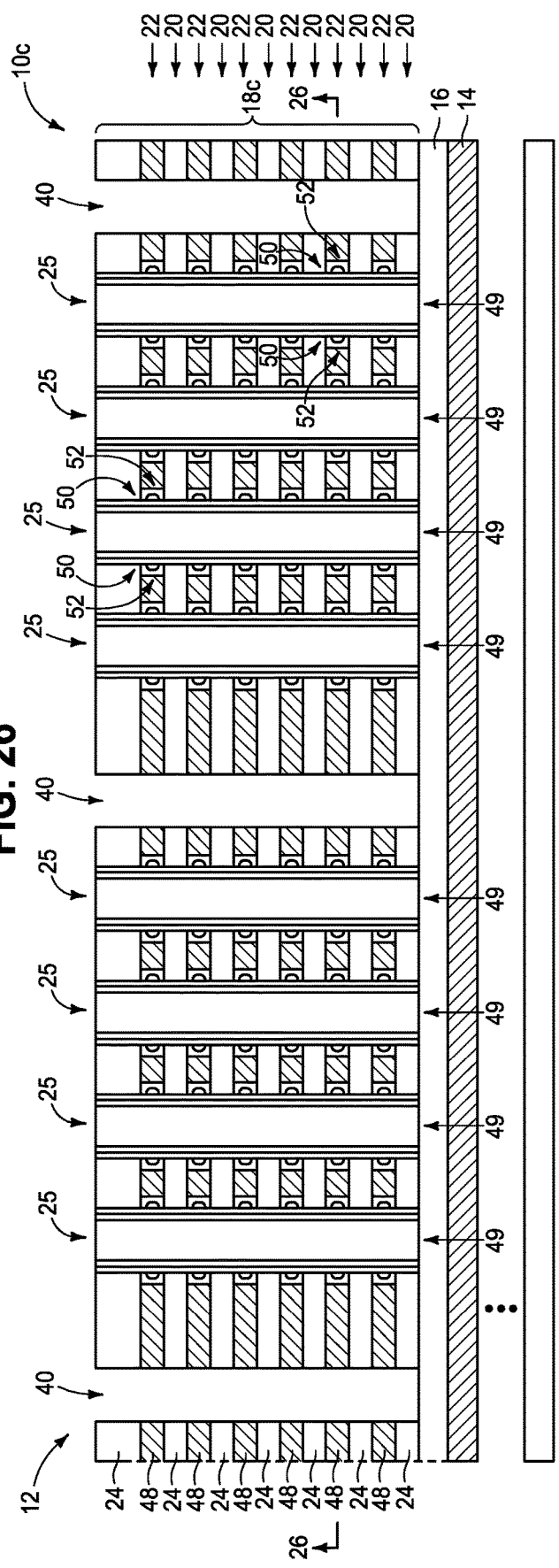
FIG. 27 is a view taken through line 27-27 in FIG. 26.

Referring to FIGS. 26 and 27, trenches 40 have been formed through stack 18*c* to conductively-doped semiconductor material 16 (i.e., at least thereto), and which forms control-gate lines 29. Subsequent and/or alternate processing may occur as described above with respect to FIGS. 11-20 whereby conductively-doped semiconductor material 16 is oxidized through trenches 40 to form oxide 44/44*a*/44*b* therefrom that is directly above metal material 14. Control-gate material 48 is provided to have terminal ends 50 corresponding to control-gate regions 52 of individual memory cells 56 and a charge-blocking region (e.g., material 30) between charge-storage material (e.g., material 32) and individual of control-gate regions 52. Any other attribute(s) or aspect(s) as shown and/or described herein with respect to other embodiments may be used.

An embodiment of the invention comprises a method of forming an array (e.g., 12) of elevationally-extending strings (e.g., 49) of memory cells (e.g., 56) regardless of whether gate-first, gate-last, or otherwise. Such a method comprises forming conductively-doped semiconductor material (e.g., 16) directly above and electrically coupled to metal material (e.g., 14). A stack (e.g., 18, 18*c*) is formed that comprises vertically-alternating insulative tiers (e.g., 20) and wordline tiers (e.g., 22) directly above the conductively-doped semiconductor material. Horizontally-elongated trenches (e.g., 40, 40*a*, 40*b*) are formed through the stack to the conductively-doped semiconductor material. The conductively-doped semiconductor material is oxidized through the trenches to form an oxide (e.g., 44, 44*a*, 44*b*) therefrom that is directly above the metal material. Transistor channel material (e.g., 36) is provided to extend elevationally along the alternating tiers. In one embodiment, such is formed by first forming elevationally-extending channel openings (e.g., 25) into the stack and into which the transistor channel material is provided. In one such embodiment, the channel openings are formed before forming the trenches, and yet in another such embodiment are formed after forming the trenches. Regardless, the wordline tiers are formed to comprise control-gate material (e.g., 48) having terminal ends (e.g., 50) corresponding to control-gate regions (e.g., 52) of individual memory cells (e.g., 56). Charge-storage material (e.g., 32) is provided between the transistor channel material and the control-gate regions. Insulative charge-passage material (e.g., 34) is provided between the transistor channel material and the charge-storage material. A charge-blocking region (e.g., 30) is provided between the charge-storage material and individual of the control-gate regions.

In one embodiment, material of the wordline tiers (e.g., 26 and/or 48) is etched selectively relative to the oxide and the insulative material, with none of the conductively-doped semiconductor material being outwardly exposed within the trenches during the etching. In one embodiment, the material of the wordline tiers that is etched is conductive (e.g., FIGS. 11, 12, and 23, and material 48). In one embodiment, the material of the wordline tiers that is etched is insulative (e.g., FIG. 9, and material 26), and the control-gate material is not provided until after the etching (e.g., FIG. 10). In one embodiment, none of the metal material is outwardly exposed within the trenches during the etching (e.g., FIGS. 11, 12, 17). In another embodiment, some of the metal material is outwardly exposed within the trenches during the etching (e.g., FIG. 20).

Any other attribute(s) or aspect(s) as shown and/or described herein with respect to other embodiments may be used.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", extend(ing) horizontally, and horizontally-extending with respect to a field effect transistor are with reference to orientation of the transistor's channel length along which current flows in operation between the source/drain regions. For bipolar junction transistors, "extend(ing) elevationally" "elevationally extending", extend(ing) horizontally, and horizontally-extending, are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components)

Any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

Herein, "selective" as to etch, etching, removing, removal, forming, and/or formation is such an act of one stated material relative to another stated material(s) so acted upon at a rate of at least 2:1 by volume.

Conclusion

In some embodiments, a method of forming an array of elevationally-extending strings of memory cells comprises forming conductively-doped semiconductor material directly above and electrically coupled to metal material. A stack comprising vertically-alternating insulative tiers and wordline tiers is formed directly above the conductively-doped semiconductor material. Horizontally-elongated trenches are formed through the stack to the conductively-doped semiconductor material. The conductively-doped semiconductor material is oxidized through the trenches to form an oxide therefrom that is directly above the metal material. Transistor channel material is provided to extend elevationally along the alternating tiers. The wordline tiers are provided to comprise control-gate material having terminal ends corresponding to control-gate regions of individual memory cells. Charge-storage material is between the transistor channel material and the control-gate regions. Insulative charge-passage material is between the transistor channel material and the charge-storage material. A charge-blocking region is between the charge-storage material and individual of the control-gate regions.

In some embodiments, a method of forming an array of elevationally-extending strings of memory cells comprises forming conductively-doped polysilicon directly above and directly against a metal silicide. A stack comprising vertically-alternating insulative tiers and wordline tiers is formed directly above the conductively-doped polysilicon. Horizontally-elongated trenches are formed through the stack and through the conductively-doped polysilicon to form the trenches to have sidewalk comprising the conductively-doped polysilicon and to outwardly expose the metal silicide. The conductively-doped polysilicon is oxidized through the trenches to form silicon dioxide therefrom that is directly above the metal silicide. The oxidizing forms the silicon dioxide all along the conductively-doped polysilicon sidewalls. Transistor channel material is provided to extend elevationally along the alternating tiers. The wordline tiers are provided to comprise control-gate material having terminal ends corresponding to control-gate regions of individual memory cells. Charge-storage material is between the transistor channel material and the control-gate regions insulative charge-passage material is between the transistor channel material and the charge-storage material. A charge-blocking region is between the charge-storage material and individual of the control-gate regions.

In some embodiments, a method of forming an array of elevationally-extending strings of memory cells comprises forming conductively-doped semiconductor material directly above and electrically coupled to metal material. A stack comprising vertically-alternating insulative tiers and wordline tiers is formed directly above the conductively-doped semiconductor material. The insulative tiers comprise insulative first material. The wordline tiers comprise second material that is of different composition from that of the first material. Elevationally-extending channel openings are formed into the alternating tiers. Charge-storage material is formed in the channel openings elevationally along the alternating tiers. Insulative charge-passage material is formed in the channel openings elevationally along the alternating tiers and the charge-storage material. Transistor channel material is formed in the channel openings elevationally along the alternating tiers and the insulative charge-passage material. Trenches are formed through the stack to the conductively-doped semiconductor material. The conductively-doped semiconductor material is oxidized through the trenches to form an oxide therefrom that is directly above the metal material. The second material of the wordline tiers is etched selectively relative to the oxide and the insulative first material. None of the conductively-doped semiconductor material is outwardly exposed within the trenches during the etching. Control-gate material is formed into the wordline tiers through the trenches to be elevationally between the insulative first material of the alternating tiers. The control-gate material has terminal ends corresponding to control-gate regions of individual memory cells. A charge-blocking region is provided between the charge-storage material and individual of the control-gate regions.

In some embodiments, a method of forming an array of elevationally-extending strings of memory cells comprises forming conductively-doped semiconductor material directly above and electrically coupled to metal material. A stack comprising vertically-alternating insulative tiers and wordline tiers is formed directly above the conductively-doped semiconductor material. The wordline tiers comprises control-gate material. Elevationally-extending channel openings are formed into the alternating tiers. Charge-storage material is formed in the channel openings elevationally along the alternating tiers. After forming the charge-storage material, insulative charge-passage material then transistor channel material are formed in the channel openings. Trenches are formed through the stack to the conductively-doped semiconductor material. The conductively-doped semiconductor material is oxidized through the trenches to form an oxide therefrom that is directly above the metal material. The control-gate material is provided to have terminal ends corresponding to control-gate regions of individual memory cells and a charge-blocking region between the charge-storage material and individual of the control-gate regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming an array of memory cells, comprising:
    forming a stack comprising vertically-alternating insulative tiers and wordline tiers over polysilicon that is above and directly against metal material, the wordline tiers comprising silicon nitride, the insulative tiers comprising silicon dioxide;
    etching through the silicon nitride and the silicon dioxide at least to the polysilicon to form horizontally-elongated trenches;
    growing an oxide from the polysilicon exposed by the etching;
    forming memory cell strings in the stack, the memory cell strings comprising channel material;
    after the growing and after forming the strings comprising channel material, etching the silicon nitride from the wordline tiers; and
    after etching the silicon nitride, forming conductive material into the wordline tiers and forming therefrom gate regions of memory cells that are part of a wordline, the memory cells of the memory cell strings comprising a memory structure between the gate regions and the channel material.

2. The method of claim 1 wherein the channel material is elongated vertically or within 10° of vertical.

3. The method of claim 1 wherein the growing forms the oxide all across respective bottoms of the horizontally-elongated trenches.

4. The method of claim 1 wherein the growing does not form the oxide all across respective bottoms of the horizontally-elongated trenches.

5. The method of claim 1 wherein the channel material is formed before forming the horizontally-elongated trenches.

6. The method of claim 1 comprising forming CMOS under-array circuitry to access and control the memory cells within the array.

7. The method of claim 1 wherein the growing is conducted wet.

8. The method of claim 1 wherein the growing is conducted dry.

9. The method of claim 1 wherein the growing comprises using oxidizing gas comprising one more of $H_2O$, $O_2$, and $N_2O$.

10. The method of claim 9 wherein the growing comprises using oxidizing gas comprising at least two of $H_2O$, $O_2$, and $N_2O$.

11. The method of claim 9 wherein the growing comprises using oxidizing gas comprising $H_2O$.

12. The method of claim 9 wherein the growing comprises using oxidizing gas comprising $O_2$.

13. The method of claim 9 wherein the growing comprises using oxidizing gas comprising $N_2O$.

14. The method of claim 1 wherein the growing comprises using remote plasma.

15. The method of claim 14 wherein the remote plasma uses $O_2$.

16. The method of claim 1 wherein the growing forms the oxide to a thickness of 50 to 200 Angstroms.

17. The method of claim 1 wherein the memory structure comprises charge-storage material between the channel material and the gate regions, insulative charge-passage material between the channel material and the charge-storage material, and a charge-blocking region between the charge-storage material and the gate regions.

18. A method of forming an array of memory cells, comprising:
    forming a stack comprising vertically-alternating insulative tiers and wordline tiers over polysilicon that is above and directly against metal material, the wordline tiers comprising silicon nitride, the insulative tiers comprising silicon dioxide;
    etching through the silicon nitride and the silicon dioxide at least to the polysilicon;
    growing an oxide from the polysilicon exposed by the etching;
    forming memory cell strings in the stack, the memory cell strings comprising channel material;
    after the growing and after forming the strings comprising channel material, etching the silicon nitride from the wordline tiers; and
    after etching the silicon nitride, forming conductive material into the wordline tiers and forming therefrom gate regions of memory cells that are part of a wordline, the memory cells of the memory cell strings comprising a memory structure between the gate regions and the channel material.

19. The method of claim 18 comprising forming CMOS under-array circuitry to access and control the memory cells within the array.

20. A method of forming an array of memory cells, comprising:

forming a stack comprising vertically-alternating insulative tiers and wordline tiers over polysilicon that is above and directly against metal material, the wordline tiers comprising silicon nitride, the insulative tiers comprising silicon dioxide;

etching through the silicon nitride and the silicon dioxide at least to the polysilicon to form horizontally-elongated trenches;

growing an oxide from the polysilicon exposed by the etching;

forming memory cell strings in the stack to comprise channel material, and silicon dioxide directly against the polysilicon;

after the growing and after forming the strings comprising channel material, etching the silicon nitride from the wordline tiers; and after etching the silicon nitride, forming conductive material into the wordline tiers and forming therefrom gate regions of memory cells that are part of a wordline, the memory cells of the memory cell strings comprising a memory structure between the gate regions and the channel material.

21. The method of claim 20 wherein the forming of the silicon dioxide of the memory cell strings does not form the silicon dioxide all across respective bottoms of the memory cell strings.

22. The method of claim 20 wherein the forming of the silicon dioxide of the memory cell strings forms the silicon dioxide all across respective bottoms of the memory cell strings before forming the channel material.

23. The method of claim 20 comprising forming CMOS under-array circuitry to access and control the memory cells within the array.

* * * * *